United States Patent [19]

Lee et al.

[11] Patent Number: 5,642,366
[45] Date of Patent: Jun. 24, 1997

[54] GLOBAL PARITY SYMBOL FOR INTERLEAVED REED-SOLOMON CODED DATA

[75] Inventors: Frank S. Lee, Milpitas; David H. Miller, Sacramento; Richard W. Koralek, Palo Alto, all of Calif.

[73] Assignee: Adaptec, Inc., Milpitas, Calif.

[21] Appl. No.: 270,858

[22] Filed: Jul. 5, 1994

[51] Int. Cl.⁶ .................................................. H03M 13/00
[52] U.S. Cl. ........................ 371/39.1; 371/37.7; 371/38.1
[58] Field of Search .............................. 371/37.1, 38.1, 371/39.1, 37.4, 37.5, 37.7, 40.1

[56] References Cited

U.S. PATENT DOCUMENTS

| | | | |
|---|---|---|---|
| 3,568,148 | 3/1971 | Clark | 340/146.1 |
| 4,410,989 | 10/1983 | Berlekamp | 371/40 |
| 4,413,339 | 11/1983 | Riggle et al. | 371/38 |
| 4,504,948 | 3/1985 | Patel | 371/38 |
| 4,633,470 | 12/1986 | Welch et al. | 371/37 |
| 4,763,332 | 8/1988 | Glover | 371/37 |
| 4,777,635 | 10/1988 | Glover | 371/40 |
| 4,821,268 | 4/1989 | Berlekamp | 371/37 |
| 4,833,678 | 5/1989 | Cohen | 371/37 |
| 4,839,896 | 6/1989 | Glover et al. | 371/37 |
| 4,843,607 | 6/1989 | Tong | 371/37 |
| 4,847,801 | 7/1989 | Tong | 364/746.1 |
| 4,890,287 | 12/1989 | Johnson et al. | 371/37 |
| 5,107,503 | 4/1992 | Riggle et al. | 371/37.1 |
| 5,170,399 | 12/1992 | Cameron et al. | 371/39.1 X |
| 5,241,546 | 8/1993 | Peterson et al. | 371/39.1 X |
| 5,383,204 | 1/1995 | Gibbs et al. | 371/37.7 |
| 5,422,895 | 6/1995 | Nguyen et al. | 371/37.5 |

*Primary Examiner*—Roy N. Envall, Jr.
*Assistant Examiner*—Brian C. Oakes
*Attorney, Agent, or Firm*—Skjerven, Morrill, MacPherson, Franklin & Friel; Edward C. Kwok

[57] ABSTRACT

A circuit and method includes a global parity symbol in a multi-way interleaved Reed-Solomon code implementation to enhance error-detection capability of the Reed-Solomon code. In one embodiment, the global parity symbol is computed over both the data symbols and the check symbols of the Reed-Solomon code, thereby providing data detection capability for errors occurring in the check symbols.

9 Claims, 17 Drawing Sheets

| $\alpha^i$ | PATTERN |
|---|---|
|  | 0000 |
| $\alpha^0$ | 0001 |
| $\alpha^1$ | 0010 |
| $\alpha^2$ | 0100 |
| $\alpha^3$ | 1000 |
| $\alpha^4$ | 0011 |
| $\alpha^5$ | 0110 |
| $\alpha^6$ | 1100 |
| $\alpha^7$ | 1011 |
| $\alpha^8$ | 0101 |
| $\alpha^9$ | 1010 |
| $\alpha^{10}$ | 0111 |
| $\alpha^{11}$ | 1110 |
| $\alpha^{12}$ | 1111 |
| $\alpha^{13}$ | 1101 |
| $\alpha^{14}$ | 1001 |

FIGURE 8

| # SYMBOLS SHIFT | SYMBOL INPUT TO LFSR | 321 322 FEEDBACK | (301) LFSR0 | (302) LFSR1 | (303) LFSR2 | (304) LFSR3 | (305) LFSR4 | (306) LFSR5 | (307) LFSR6 | (308) LFSR7 | (309) LFSR8 | (310) LFSR9 |
|---|---|---|---|---|---|---|---|---|---|---|---|---|
| 0 (CURRENT STATE) | | | $r_0$ | $r_1$ | $r_2$ | $r_3$ | $r_4$ | $r_5$ | $r_6$ | $r_7$ | $r_8$ | $r_9$ |
| 1 | $d_h$ | $f_0 = d_h \oplus r_0$ | $r_1$ | $r_2$ | $\alpha^{10} f_0 \oplus r_3$ | $r_4$ | $r_5$ | $\alpha^{11} f_0 \oplus r_6$ | $r_7$ | $r_8$ | $\alpha^3 f_0$ | $\alpha(d_h \oplus r_9)$ |
| 2 | $d_1$ | $f_1 = d_1 \oplus r_1$ | $r_2$ | $\alpha^{10} f_0 \oplus r_3$ | $\alpha^{10} f_1 \oplus r_4$ | $r_5$ | $\alpha^{11} f_0 \oplus r_6$ | $\alpha^{11} f_1 \oplus r_7$ | $r_8$ | $\alpha^3 f_0$ | $\alpha^3 f_1$ | $\alpha^2(d_h \oplus r_9) \oplus \alpha d_1$ |

FIGURE 9

|  | BIT 3 | BIT 2 | BIT 1 | BIT 0 |
|---|---|---|---|---|
| $\beta$ | $\beta_3$ | $\beta_2$ | $\beta_1$ | $\beta_0$ |
| $\alpha\beta$ | $\beta_2$ | $\beta_1$ | $\beta_0+\beta_3$ | $\beta_3$ |
| $\alpha^2\beta$ | $\beta_1$ | $\beta_0+\beta_3$ | $\beta_3+\beta_2$ | $\beta_2$ |
| $\alpha^3\beta$ | $\beta_0+\beta_3$ | $\beta_3+\beta_2$ | $\beta_2+\beta_1$ | $\beta_1$ |
| $\alpha^{11}\beta=\alpha^3\beta+\alpha^2\beta+\alpha\beta$ | $\beta_3+\beta_2+\beta_1+\beta_0$ | $\beta_2+\beta_1+\beta_0$ | $\beta_1+\beta_0$ | $\beta_1+\beta_2+\beta_3$ |
| $\alpha^{10}\beta=\alpha^2\beta+\alpha\beta+\beta$ | $\beta_3+\beta_2+\beta_1$ | $\beta_3+\beta_2+\beta_1+\beta_0$ | $\beta_2+\beta_1+\beta_0$ | $\beta_0+\beta_3+\beta_2$ |

FIGURE 10

| # SYMBOLS CALCULATED | SYMBOL INPUT TO THE LFSRs | $S_0$ | | | $S_1$ | | | $S_2$ | | | $S_{GP}$ |
|---|---|---|---|---|---|---|---|---|---|---|---|
| | | $S_{02}$ | $S_{01}$ | $S_{00}$ | $S_{12}$ | $S_{11}$ | $S_{10}$ | $S_{22}$ | $S_{21}$ | $S_{20}$ | $S_{GP}$ |
| 0 (CURRENT STATE) | | $r_{02}$ | $r_{01}$ | $r_{00}$ | $r_{12}$ | $r_{11}$ | $r_{10}$ | $r_{22}$ | $r_{21}$ | $r_{20}$ | $r_{GP}$ |
| 1 | $d_h$ | $r_{01}$ | $r_{00}$ | $r_{02} \oplus d_h$ | $r_{11}$ | $r_{10}$ | $\alpha r_{12} \oplus d_h$ | $r_{21}$ | $r_{20}$ | $\alpha^2 r_{22} \oplus d_h$ | $d_h \oplus \alpha r_{GP}$ |
| 2 | $d_l$ *1 | $r_{00}$ | $r_{02} \oplus d_h$ | $r_{01} \oplus d_l$ | $r_{10}$ | $\alpha r_{12} \oplus d_h$ | $\alpha r_{11} \oplus d_l$ | $r_{20}$ | $\alpha^2 r_{22} \oplus d_h$ | $\alpha^2 r_{21} \oplus d_l$ | $d_l \oplus \alpha(d_h \oplus \alpha r_{GP})$ |

FIGURE 11

| PTN[3:0] | NIBBLE[5:0] | REMARKS |
| --- | --- | --- |
| 0001 | -36 | DATA FIELD: OUT OF RANGE IF IDLEN < 18. |
| 0010 | 6 | IN CHECK BYTE 3. |
| 0100 | 3 | IN CHECK BYTE 1. |
| 1000 | 0 | IN CHECK BYTE 0. |
| 0011 | -3 | DATA FIELD: OUT OF RANGE IF IDLEN < 2. |
| 0110 | -6 | DATA FIELD: OUT OF RANGE IF IDLEN < 3. |
| 1100 | -9 | DATA FIELD: OUT OF RANGE IF IDLEN < 5. |
| 1011 | -12 | DATA FIELD: OUT OF RANGE IF IDLEN < 6. |
| 0101 | -15 | DATA FIELD: OUT OF RANGE IF IDLEN < 8. |
| 1010 | -18 | DATA FIELD: OUT OF RANGE IF IDLEN < 9. |
| 0111 | -21 | DATA FIELD: OUT OF RANGE IF IDLEN < 11. |
| 1110 | -24 | DATA FIELD: OUT OF RANGE IF IDLEN < 12. |
| 1111 | -27 | DATA FIELD: OUT OF RANGE IF IDLEN < 14. |
| 1101 | -30 | DATA FIELD: OUT OF RANGE IF IDLEN < 15. |
| 1001 | -33 | DATA FIELD: OUT OF RANGE IF IDLEN < 17. |
| 0000 | X | NO ERROR. IF ERROR EXISTS IN INTERLEAVE 0 AND PTN[3:0] = 0, ERROR MUST BE UNCORRECTABLE. |

FIG. 12A

| PTN[3:0] | NIBBLE[5:0] | REMARKS |
|---|---|---|
| 0001 | 8 | IN CHECK BYTE 4. |
| 0010 | 5 | IN CHECK BYTE 2. |
| 0100 | 2 | IN CHECK BYTE 1. |
| 1000 | -1 | DATA FIELD. |
| 0011 | -4 | DATA FIELD: OUT OF RANGE IF IDLEN < 2. |
| 0110 | -7 | DATA FIELD: OUT OF RANGE IF IDLEN < 4. |
| 1100 | -10 | DATA FIELD: OUT OF RANGE IF IDLEN < 5. |
| 1011 | -13 | DATA FIELD: OUT OF RANGE IF IDLEN < 7. |
| 0101 | -16 | DATA FIELD: OUT OF RANGE IF IDLEN < 8. |
| 1010 | -19 | DATA FIELD: OUT OF RANGE IF IDLEN < 10. |
| 0111 | -22 | DATA FIELD: OUT OF RANGE IF IDLEN < 11. |
| 1110 | -25 | DATA FIELD: OUT OF RANGE IF IDLEN < 13. |
| 1111 | -28 | DATA FIELD: OUT OF RANGE IF IDLEN < 14. |
| 1101 | -31 | DATA FIELD: OUT OF RANGE IF IDLEN < 16. |
| 1001 | -34 | DATA FIELD: OUT OF RANGE IF IDLEN < 17. |
| 0000 | X | NO ERROR. IF ERROR EXISTS IN INTERLEAVE 1 AND PTN[3:0] = 0, ERROR MUST BE UNCORRECTABLE. |

FIG. 12B

| PTN[3:0] | NIBBLE[5:0] | REMARKS |
|---|---|---|
| 0001 | 7 | IN CHECK BYTE 3. |
| 0010 | 4 | IN CHECK BYTE 2. |
| 0100 | 1 | IN CHECK BYTE 0. |
| 1000 | -2 | DATA FIELD. |
| 0011 | -5 | DATA FIELD: OUT OF RANGE IF IDLEN < 3. |
| 0110 | -8 | DATA FIELD: OUT OF RANGE IF IDLEN < 4. |
| 1100 | -11 | DATA FIELD: OUT OF RANGE IF IDLEN < 6. |
| 1011 | -14 | DATA FIELD: OUT OF RANGE IF IDLEN < 7. |
| 0101 | -17 | DATA FIELD: OUT OF RANGE IF IDLEN < 9. |
| 1010 | -20 | DATA FIELD: OUT OF RANGE IF IDLEN < 10. |
| 0111 | -23 | DATA FIELD: OUT OF RANGE IF IDLEN < 12. |
| 1110 | -26 | DATA FIELD: OUT OF RANGE IF IDLEN < 13. |
| 1111 | -29 | DATA FIELD: OUT OF RANGE IF IDLEN < 15. |
| 1101 | -32 | DATA FIELD: OUT OF RANGE IF IDLEN < 16. |
| 1001 | -35 | DATA FIELD: OUT OF RANGE IF IDLEN < 18. |
| 0000 | X | NO ERROR. IF ERROR EXISTS IN INTERLEAVE 2 AND PTN[3:0] = 0, ERROR MUST BE UNCORRECTABLE. |

FIG. 12C

| $S_0=S_1=S_2=0?$ | $S_1=0?$ | $S_0*S_2=S_1^2$ | SYNOK | ERR |
|---|---|---|---|---|
| YES | (MUST BE 0) | (MUST BE EQUAL) | 1 | 0 |
| NO | NO | NO | 0 | 1 |
| NO | NO | YES | 1 | 1 |
| NO | YES | DON'T CARE | 0 | 1 |

FIG. 13

| PTN[3:0] | LOG[3:0] |
|---|---|
| 0000 | XXXX |
| 0001 | 0001 |
| 0010 | 1001 |
| 0011 | 1110 |
| 0100 | 1101 |
| 0101 | 1011 |
| 0110 | 0111 |
| 0111 | 0110 |
| 1000 | 1111 |
| 1001 | 0010 |
| 1010 | 1100 |
| 1011 | 0101 |
| 1100 | 1010 |
| 1101 | 0100 |
| 1110 | 0011 |
| 1111 | 1000 |

FIG. 14

GLOBAL PARITY SYMBOL FOR INTERLEAVED REED-SOLOMON CODED DATA

BACKGROUND OF THE INVENTION

1. Field of the Invention

This invention relates to electronic circuits for ensuring data integrity in data storage or data communication applications; in particular, this invention relates to minimizing the probability of miscorrection in applying error correction and error detection codes to data storage and data communication applications.

2. Discussion of the Related Art

Error correction and error detection codes have been used extensively in data communication and data storage applications. In a data communication application, data is encoded prior to transmission, and decoded at the receiver. In a data storage application, data is encoded when stored in a storage device, e.g. a disk drive, and decoded when retrieved from the storage device. For the present discussion, it is unnecessary to distinguish between these applications. Hence, although the remainder of this description describes a data storage-retrieval system, the principles discussed herein are equally applicable to a data communication application.

In a typical application of error detection and correction codes, data symbols are stored in blocks, which each include a selected number of special symbols, called check symbols. A symbol may consist of a single bit or multiple bits. The check symbols in each block represent redundant information concerning the data stored in the block. When decoding the blocked data, the check symbols are used to detect both the presence and the locations of errors and, in some instances, correct these errors. The theory and applications of error correction codes are described extensively in the literature. For example, the texts (i) "Error-Correcting Codes", Second Edition, by W. Wesley Peterson and E. J. Weldon, published by the MIT Press, Cambridge, Mass. (1972), and (ii) "Practical Error Correction Design for Engineers", revised second edition, by N. Glover and T. Dudley, Cirrus Logic, Colorado, publisher (1991), are well-known to those skilled in the art.

In a typical application of error correction codes, the input data is divided into fixed-length blocks ("code words"). Each code word consists of n symbols, of which a fixed number k are data symbols, and the remaining (n–k) symbols are check symbols. (For convenience, in this description, such a code is referred to as an (n, k) code). As mentioned above, the check symbols represent redundant information about the code word and can be used to provide error correction and detection capabilities. Conceptually, each data or check symbol of such a code word represents a coefficient of a polynomial of order (n–1). In the error correcting and detecting codes of this application, the check symbols are the coefficients of the remainder polynomial generated by dividing the order (n–1) polynomial by an order (n–k) "generator" polynomial over a Galois field[1]. For an order (n–1) polynomial divided by an order (n–k) polynomial, the remainder polynomial is of order (n–k–1). Typically, in a data storage application, both the data symbols and the check symbols are stored.

[1]For a discussion of Galois fields, the reader is directed to §6.5 in the aforementioned text "Error-Correcting Codes" by W. Peterson and E. Weldon Jr.

During decoding, both data symbols and check symbols are read from the storage medium, and one or more "syndromes" are computed from the code word (i.e. the data and the check symbols) retrieved. A syndrome is a characteristic value computed from a remainder polynomial, which is obtained by dividing the code word retrieved by the generator polynomial. Ideally, if no error is encountered during the decoding process, all computed syndromes are zero.[2] A non-zero syndrome indicates that one or more errors exist in the code word. Depending on the nature of the generator polynomial, the encountered error may or may not be correctable. If the generator polynomial can be factorized, a syndrome computed from the remainder polynomial obtained by dividing the retrieved code word by one of the factors of the generator polynomial is called a "partial syndrome".

[2]In some applications, e.g. in certain cyclic redundancy check schemes, a non-zero characteristic number results when no error is encountered. Without loss of generality, a syndrome of zero is assumed when no detectable error is encountered.

A useful measure for quantifying the difference between two binary words is the "Hamming distance", which is defined as the number of bit positions at which the two words differ. For example, the 4-bit words '0000' and '0010' have between them a Hamming distance of one since these words differ only at the second least significant bit. In the design of error correction codes or error detection codes, a measure "minimum distance" can be defined. The minimum distance is the minimum Hamming distance between valid code words. In such an error correction or detection code, if the valid code word and the retrieved code word have a Hamming distance between them which is less than the minimum distance, the probability is high that the retrieved code word results from errors occurring in the valid code word at the bit positions defining the Hamming distance between these words. Thus, in error correction codes, the decoder can resolve, with minimum risk of miscorrecting the retrieved code word, in favor of the valid code word having the smallest Hamming distance from the retrieved code word[3]. Of course, if the minimum distance is an even integer, ambiguity for error correction exists when a retrieved code word is the same Hamming distance from two or more valid code words. For an error correcting code with a minimum distance d, the numbers of errors which can be corrected and detected are $$\lfloor \frac{d-1}{2} \rfloor^4 \text{ and } d-1-2*\lfloor \frac{d-1}{2} \rfloor,$$

respectively. The concepts of the Hamming distance and the minimum distance can be extended to multi-bit symbols. In such an extension, the Hamming distance and the minimum distance are each expressed in symbol units. For example, if an error correction code using multi-bit symbols, the Hamming distance is defined as the number of symbol positions at which two code words differ. In such an error correction code, two code words differ by a distance of one, if they differ at one symbol position, regardless of the number of bit positions these code words differ within the corresponding symbols at that symbol position.

[3]The probability of miscorrection is given by:

$$P_{MC} = \frac{\text{no. of correctable error patterns}}{\text{no. of total parity patterns} = 2^{\text{no. of parity bits}}}$$

[4]Here, the symbol ⌊x⌋ denotes the floor function of x.

One goal in designing error correction and error detection codes is the selection of an appropriate minimum distance. In general, the minimum distance of an error correction code can be increased by increasing the number of check symbols in a code word. At the same time, however, increasing the number of check symbols in a code word increases both the complexity of the necessary decoding logic and the overhead cost (in terms of decoding time and storage space) associated with the additional check symbols. The capability of an error correction or detection code is sometimes characterized by the size of the maximum error burst the code can correct or detect. For example, a convenient capability measure is the "single error burst correction" capability, which characterizes the code by the maximum length of consecutive error bits the code can correct, as measured from the first error bit to the last error bit, if a single burst of error occurs within a code word. Another example of a capability measure would be the "double error burst detection" capability, which characterizes the error correction or error detection code by the maximum length of each error burst the error correction code can detect, given that two or less bursts of error occur within a code word.

A well-known class of error correcting codes is the Reed-Solomon codes, which are characterized by the generator polynomial G(X), given by:

$$G(X)=(X+\alpha^j)(X+\alpha^{j+1})(X+\alpha^{j+2}) \ldots (X+\alpha^{j+i-1})(X+\alpha^{j+i})$$

where $\alpha$ is a primitive element of $GF(2^m)$ and, i and j are integers.

Because errors often occur in bursts, a technique, called "interleaving", is often used to spread the consecutive error bits or symbols into different "interleaves", which can each be corrected individually. Interleaving is achieved by creating a code word of length nw from w code words of length n. In one method for forming the new code word, the first w symbols of the new code word are provided by the first symbols of the w code words taken in a predetermined order. In the same predetermined order, the next symbol in each of the w code words is selected to be the next symbol in the new code word. This process is repeated until the last symbol of each of the w code words is selected in the predetermined order into the new code word. Another method to create a w-way interleaved code is to replace a generator polynomial G(X) of an (n, k) code by the generator polynomial $G(X^w)$. This technique is applicable, for example to the Reed-Solomon codes mentioned above. Using this new generator polynomial $G(X^w)$, the resulting (nw, kw) code has the error correcting and detecting capability of the original (n, k) code in each of the w interleaves so formed.

Another approach used in the prior art for error detection is the use of the cyclic redundancy check (CRC) symbols. Under this approach, a CRC checksum, which is the value of a polynomial function applied to the input data, is computed. This CRC checksum is transmitted or stored with the data and is recomputed at the receiver or when retrieved. If no error is encountered, the computed CRC checksum matches the retrieved or received CRC checksum. Otherwise, one or more errors exist in the data or the retrieved CRC checksum. Unlike error correction codes, the CRC checksum does not pin-point where the error or errors occur, and thus does not provide the capability for correcting errors.

In a practical implementation, the full error correction capability of an error correction code is often not fully exploited because the complexity of logic circuits required for error location and error correction can become prohibitive for a relatively small minimum distance. It is, however, desirable to exploit the full capability of error detection, even though the full capability of error correction is not exploited. Indeed, in some applications, the consequence of a miscorrection is extremely undesirable. In those applications, an error is merely flagged, so that some other error recovery procedures may take over. For example, in a disk drive application, during data read, noise may cause a transient error in the magnetic head mechanism. Such an error is best handled by re-reading the sector from which the error occurred, rather than by attempting to correct the faulty data. In such an application, the additional cost of exploiting the full capability of the error correction code may not be economically justified.

SUMMARY OF THE INVENTION

In accordance with the present invention, in an interleaved Reed-Solomon error correcting code, a method is provided for increasing the minimum distance in each interleave by including only a single global parity symbol. The method of the present invention includes the steps of: (a) receiving a plurality of data symbols; (b) computing, in each interleave, a code word including the data symbols and a plurality of check symbols, the check symbols being generated by a generator polynomial given by:

$$G(X)=(X+\alpha^j)(X+\alpha^{j+1})(X+\alpha^{j+2}) \ldots (X+\alpha^{j+i-1})(X+\alpha^{j+i})$$

where $\alpha$ is a primitive element of $GF(2^m)$ and, i and j are integers; and (c) providing a global parity symbol GP associated with a syndrome $S_{GP}$ given by one of:

$$S_{GP} = \sum_{w_0=0}^{w-1} S_{(i+j+1)w_0} \gamma_{w_0}$$

or $$S_{GP} = \sum_{w_0=0}^{w-1} S_{(j-1)w_0} \gamma_{w_0}$$

where $\gamma_0, \gamma_1, \ldots, \gamma_{w-1}$ are non-zero elements of a galois field $GF(2^m)$, and $S_{(i+j+1)w_0}$ and $S_{(j-m)w_0}$ are, respectively, the partial syndromes corresponding to $(X+\alpha^{i+j+1})$ and $(X+\alpha^{j-1})$ for interleave $w_0$.

In accordance with one aspect of the present invention, the method provides check symbols of a Reed-Solomon code using a single generator polynomial:

$$G_w(X)=(X^w+\alpha^j)(X^w+\alpha^{j+1}) \ldots (X^w+\alpha^{j+i-1})(X^w+\alpha^{j+i})$$

In accordance with another aspect of the present invention, when the number w of interleaves divides (j+i+1), the global parity symbol GP can be computed over all interleaves using a single second generator function $$\left( X+\alpha^{\frac{(i+j+1)}{w}} \right).$$

Alternatively, when the number w of interleaves divides (j−1), the global parity symbol GP can be computed over all interleaves using a single second generator function $$\left( X+\alpha^{\frac{(j-1)}{w}} \right).$$

By computing the global parity symbol GP over all interleaves using a single second generator function, the amount of hardware used to generate global parity symbol GP is greatly reduced.

In one embodiment, the global parity symbol GP is computed as part of the Reed-Solomon error correction code word. For example, such a Reed-Solomon error correction code can be generator by the generator polynomial:

$$G_w(X) = (X^w + \alpha^j)(X^w + \alpha^{j+1})\ldots$$

$$\ldots (X^w + \alpha^{j+i-1})(X^w + \alpha^{j+i})\left(X + \alpha^{\frac{(i+j+1)}{w}}\right)$$

When the global parity symbol GP is computed as part of the Reed-Solomon code word, if an error occurs with in the parity symbol GP, such error can be corrected using the error correction capability of the Reed-Solomon code.

The error correcting code of the present invention can be decoded by computing partial syndromes $S_j$, $S_{j+1}$, $S_{j+2}$, $\ldots$, $S_{j+i}$, of the generator function and the syndrome $S_{GP}$.

In one embodiment, the decoding circuit limits error correction to a single error burst of less than a predetermined number of symbols. In that embodiment, the Reed-Solomon error correcting code is 3-way interleaved. In accordance with the present invention, the Reed-Solomon error correcting code of that embodiment, estimates the syndrome $S_{GP}$ using the relation:

$$S_{GP} = S_3(\alpha) = S_{32}\alpha^2 + S_{31}\alpha + S_{30}$$

In another embodiment, a 3-way interleaved Reed-Solomon error correcting code generates a global parity symbol GP using a polynomial $(X+\alpha^v)$, where v is an integer. In that embodiment, the syndrome $S_{GP}$ is estimated using the relation:

$$S_{GP} = S_{32}\alpha^{2v} + S_{31}\alpha^v + S_{30}$$

One advantage of the present invention over the prior art is that, in an interleaved implementation, the Hamming distance for each interleave is increased by one. In other words, the present invention increases the number of errors detectable in each interleave by one. The present invention achieves this increase in Hamming distance in each interleave by including a single global check symbol, rather than by including a check symbol in each interleave, as is required in the prior art.

The present invention is better understood upon consideration of the detailed description below and the accompanying drawings.

BRIEF DESCRIPTION OF THE DRAWINGS

FIG. 8, also referred to as Table 1, shows the 16 elements of the Galois field $GF(2^4)$ used in an embodiment of the present invention.

FIG. 9, also referred to as Table 2, shows the derivation of the logic equations for check symbol generation circuit 200 illustrated in FIG. 2.

FIG. 10, also referred to as Table 3, shows the logic equation for each of the bits in the results of multiplying a 4-bit data symbol $\beta$ to constants $\alpha$, $\alpha^2$, and $\alpha^3$, $\alpha^{10}$, and $\alpha^{11}$ respectively within the Galois field $GF(2^4)$ defined in Table 1.

FIG. 11, also referred to as Table 4, shows the logic equations for the next coefficients of syndromes $S_i$ (i=0, 1, and 2) in circuits 400, 430 and 460, as expressed in terms of input values $d_h$ and $d_l$, and the previous values $r_{ij}$ (i,j=0, 1, and 2) of syndromes $S_i$.

FIGS. 12A, 12B and 12C, also respectively referred to as Tables 5a, 5b and 5c, provide the physical locations of errors occurring in the respective one of interleaves 0, 1, and 2, in the present embodiment.

FIG. 13, also referred to as Table 6, shows the various error conditions in an interleave recognized by the present embodiment.

FIG. 14, also referred to as Table 7, shows the multiplicative inverses of the elements in the Galois field $GF(2^4)$ defined in Table 1.

DETAILED DESCRIPTION OF THE PREFERRED EMBODIMENTS

Figure 1:
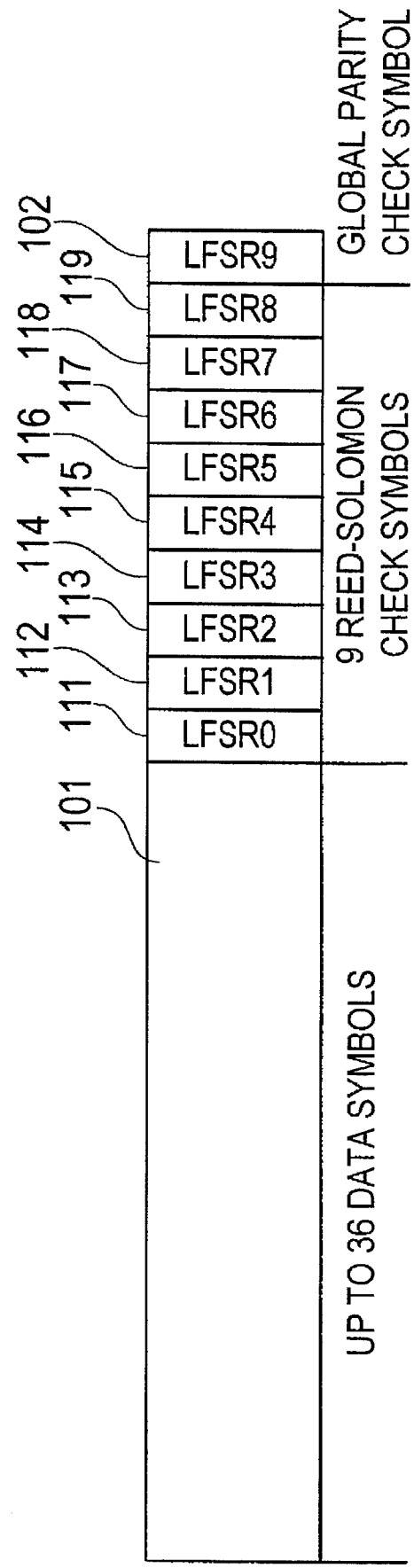
FIG. 1 shows an organization of a Reed-Solomon code used in one embodiment of the present invention.

The present invention is illustrated by an implementation using 4-bit symbols in a Galois field $GF(2^4)$, which is defined by the following primitive polynomial over Galois field $GF(2)$:

$$f(x) = x^4 + x + 1$$

where x denotes a single bit.

Table 1 shows a zero and the 15 non-zero elements $\alpha^i$ of the Galois field $GF(2^4)$ so defined. In such a Galois field, the element $\alpha$ is known as a "primitive" element. Note that the Galois field $GF(2^4)$ generated by the above primitive polynomial is only one of the possible extended 4-bit Galois fields derivable from the Galois field $GF(2)$, i.e. there is at least one other primitive polynomial that generates another extended Galois field $GF(2^4)$ different from the one shown in FIG. 1. However, in the remainder of this detailed description, any reference below to a $GF(2^4)$ Galois field is understood to refer to the $GF(2^4)$ Galois field tabulated in Table 1.

The present invention provides a global parity ("GP") symbol in conjunction with a w-way interleaved Reed-Solomon code. According to the present invention, the GP symbol is computed from a set of parity symbols which, in turn, are each computed from data and check symbols in a single interleave. In the present invention, the GP symbol is transmitted or stored with the Reed-Solomon code, either as part of the Reed-Solomon code or apart from the Reed-Solomon code. The parity symbols from which the GP symbol is calculated need not be transmitted or stored.

Conventionally, one example of a Reed-Solomon code having a minimum distance of 5 has a generator polynomial g(X), given by:

$$g(X) = (X+1)(X+\alpha)(X+\alpha^2)(X+\alpha^3)$$

where X denotes a symbol.

As discussed above, based on the above generator function, a three-way interleave Reed-Solomon code having the same distance of 5 in each interleave can be obtained using a generator polynomial g'(X), which is given by:

$$g'(X)=(X^3+1)(X^3+\alpha)(X^3+\alpha^2)(X^3+\alpha^3)$$

Polynomial g'(X) would have a distance of 5 in each interleave, i.e. a maximum of two errors can be corrected and additional 3 errors can be detected in each interleave. Clearly, twelve check symbols are required under this approach to achieve the minimum distance of 5 in each interleave.

As will be demonstrated below, the present invention provides a single global parity symbol GP, in lieu of extra w check symbols of a w-way interleaved Reed-Solomon code, without reducing the minimum Hamming distance of each interleave in the resulting code word. Thus, for example, under the present embodiment, the total number of check symbols required to be stored or transmitted, including the GP symbol, would be reduced from twelve to ten, without affecting the minimum distance of 5 in each interleave. Equivalently, by incorporating only a single global parity symbol GP, rather than the number of check symbols equalling the number of interleaves, the present invention increases an interleaved Reed-Solomon code's Hamming distance in each interleave by one.

In general, for a w-way interleave implementation, in which the code word in each interleave is generated by the generator polynomial:

$$G(X)=(X+\alpha^j)(X+\alpha^{j+1})(X+\alpha^{j+2}) \ldots (X+\alpha^{j+i-1})(X+\alpha^{j+i})$$

where $\alpha$ is a primitive element of $GF(2^m)$ and, i and j are integers, the global syndrome $S_{GP}$ can be provided by either:

$$S_{GP} = \sum_{w_0=0}^{w-1} S_{(i+j+1)w_0}\gamma_{w_0}$$

or $$S_{GP} = \sum_{w_0=0}^{w-1} S_{(j-1)w_0}\gamma_{w_0}$$

where $\gamma_0, \gamma_1, \ldots, \gamma_{w-1}$ are non-zero elements of $GF(2^m)$, and $S_{(i+j+1)w_0}$ and $S_{(j-1)w_0}$ are, respectively, the partial syndromes for interleave $w_0$ corresponding to $(X+\alpha^{i+j+1})$ and $(X+\alpha^{j-1})$. Further, the w-way interleaved code word can also be generated by a single generator polynomial:

$$G_w(X)=(X^w+\alpha^j)(X^w+\alpha^{j+1}) \ldots (X^w+\alpha^{j+i-1})(X^w+\alpha^{j+i})$$

In this instance, when the number of interleaves (i.e. w) divides either (j+i+1) or (j−1), one possible global parity syndrome $S_{GP}$ can be computed over all interleaves using a single second generator function $$\left(X+\alpha^{\frac{(i+j+1)}{w}}\right) \text{ or } \left(X+\alpha^{\frac{(j-1)}{w}}\right),$$

rather than a sum of individual syndromes from each interleave. Calculating $S_{GP}$ in this manner is possible because, according to remainder theorem, when w divides (i+j+1), then $$\left(X+\alpha^{\frac{(i+j+1)}{w}}\right)$$

is a factor of $(X^w+\alpha^{i+j+1})$. Likewise, if w divides (j−1), then $$\left(X+\alpha^{\frac{(j-1)}{w}}\right)$$

is a factor of $(X^w+\alpha^{j-1})$.

The global parity symbol GP may be computed as part of the code word, or outside of the code word. If the global parity symbol GP is computed as part of the code word, error occurring in the GP symbol can be corrected or detected, as in Reed-Solomon code word.

A three-way interleaved embodiment of the present invention is now described. In this embodiment, the check symbols and the GP symbol are computed using a generator polynomial g"(X), which is derived from generator polynomial g'(X) above.

g"(X) is defined as follows:

$$\begin{aligned}g''(X) &= (X^3 + 1)(X^3 + \alpha)(X^3 + \alpha^2)(X\alpha) \\ &= X^{10} + \alpha X^9 + \alpha^{10}X^7 + \alpha^{11}X^6 + \alpha^{11}X^4 + \alpha^{12}X^3 + \alpha^3 X + \alpha^4\end{aligned}$$

Polynomial g"(X) is obtained, in accordance with the present invention, by combining the generator polynomial:

$$(X^3+1)(X^3+\alpha)(X^3+\alpha^2)$$

with a second generator polynomial $(X+\alpha)$ over all interleaves. As discussed above, a global parity syndrome $S_{GP}$ can be computed from the second generator polynomial $(X+\alpha)$. This global parity syndrome $S_{GP}$, as will be demonstrated below, can be used to estimate the coefficients of the partial syndrome related to $(X^3+\alpha^3)$. The expanded expression for polynomial g"(X) above is valid for the Galois field $GF(2^4)$ defined in Table 1 above. In the above $GF(2^4)$ Galois field, with 4-bit symbols and a three-way interleave, the number of symbols in each Reed-Solomon code word is provided by $3*(2^4-1)=45$.

As discussed above, g"(X) can be viewed as a product of polynomials $G_1(X)$ and $G_2(X)$, which are defined as follows:

$$\begin{aligned}G_1(X) &= (X^3 + 1)(X^3 + \alpha)(X^3 + \alpha^2) \\ &= X^9 + \alpha^{10}X^6 + \alpha^{11}X^3 + \alpha^3 \\ G_2(X) &= (X + \alpha)\end{aligned}$$

The present embodiment generates the global parity symbol GP outside of the Reed-Solomon code word. Using $G_1(X)$ as the generator function for a Reed-Solomon error correcting code, the number of check symbols in the resulting error correcting code is 9, thereby leaving a maximum length data field of 36 data symbols, which fit into 18 bytes. Using $G_2(X)$ to provide the global parity symbol GP, the check symbols corresponding to both polynomials $G_1(X)$ and $G_2(X)$ can simply be provided in 5 bytes (10 check symbols) following the 18 byte data field. In a computer having a byte-oriented memory organization, having the data, check and global parity symbols fit into an integral number of bytes is an advantageous arrangement because such arrangement minimizes the complexity due to byte alignment. Of course, a shorter data field can also be used. For example, in one embodiment, only 16 bytes are provided in the data field.

In this embodiment, the global parity syndrome $S_{GP}(\alpha)$ for polynomial $G_2(X)$ is related to partial syndrome $S_3(\alpha)$ of polynomial g'(X) by:

$$S_{GP}(\alpha)=S_3(\alpha)=S_{32}\alpha^2+S_{31}\alpha+S_{30}$$

where the syndromes $S_{32}$, $S_{31}$, and $S_{30}$ are respectively the syndromes relating to factor polynomial $(X+\alpha^3)$ in each of interleaves 2, 1, and 0.

According to coding theory, in a w-way interleaved Reed-Solomon code, syndromes $S_{jw_0}$, $S_{(j+1)w_0}$, $\ldots$, $S_{(j+i)w_0}$ in interleave $w_0$ ($w_0=0, 1, 2, \ldots w-1$) can be computed respectively from dividing the code word of each interleave by factor polynomials $(X+\alpha^j), (X+\alpha^{j+1}), \ldots, (X+\alpha^{j+i})$. These syndromes are related, in a single error case, by the following equations:

$$S_{jw_0} = \epsilon\alpha^{jw_0};\ S_{(j+1)w_0} = \epsilon\alpha^{(j+1)w_0};\ \ldots;\ S_{(j+i)w_0} = \epsilon\alpha^{(j+i)w_0}$$

Thus, in this embodiment, the values of $S_{32}$, $S_{31}$, and $S_{30}$ can be estimated from partial syndromes $S_2w_0$ and $S_1w_0$, using the relation: where $ES_{3w_0}$ is the estimated value of $S_{3w_0}$. In fact, $$ES_{3w_0} = \frac{S^2_{2w_0}}{S_{1w_0}}$$

if any two of the quantities $S_{32}$, $S_{31}$, and $S_{30}$ in partial syndrome $S_3$ are found, the third quantity can be easily computed algebraically. Because $S_{GP}(\alpha)$ is related to $S_3(\alpha)$, by selecting as $G_2(X)$ a factor of $S_3(X)$, further confidence in error detection is achieved by verifying the $S_{GP}(\alpha)$ against an estimated $ES_i(\alpha)$ which is computed from the $ES_{iw_0}$, according to the relation:

$$S_{GP}(\alpha) = ES_3(\alpha) = ES_{31}\alpha^2 + ES_{32}\alpha + ES_{30}$$

Of course, the global parity syndrome can also be computed as $SGP(\alpha^v)$, where v is any integer, $S_{GP}(\alpha^v)$ and $S_3(\alpha^v)$ are related by:

$$S_{GP}(\alpha^v) = S_{32}\alpha^{2v} + S_{31}\alpha^v + S_{30}$$

In fact, the same data integrity assurance can be provided by a global parity symbol GP constructed such that it's syndrome $S_{GP}$ relates to $S_{32}$, $S_{31}$, and $S_{30}$ through $\alpha_2$, $\alpha_1$ and $\alpha_0$, where $\alpha_i$ (i=0, 1, 2) is any non-zero element of the same $GF(2^4)$:

$$S_{GP} = S_{32}\alpha_2 + S_{31}\alpha_1 + S_{30}\alpha_0$$

Thus, polynomial g"(X) has a global distance of 5, representing a correction capability of one error in each interleave and the ability to detect two additional errors, using only ten check symbols. In this embodiment, since the global parity symbol GP is not included in the code word, the error correction code corresponding to generator polynomial g"(X) can be viewed as a concatenation of a Reed-Solomon code with 9 check symbols and a global parity symbol.

The error correcting code of the present invention, for example the error code corresponding to generator polynomial g"(X), maintains the same global distance as a corresponding Reed-Solomon code, while requiring less overhead storage and decoding than the corresponding Reed-Solomon code. The error correction code in this embodiment can correct a single burst error spanning four symbols (13 bits), and can detect a single burst error spanning six symbols (21 bits).

As discussed above, to achieve a predetermined level of performance, the full capability of an error correction code need not be implemented. Of course, to achieve a greater error correction capability, the decoding circuit necessary becomes increasingly complex. Thus, under the present invention, one is still free to apply engineering judgment to achieve varying degrees of error correction and detection capabilities, using circuits of commensurate complexities. For example, in the implementation to be described below, a burst limiting circuit limits the error correction span to three symbols (9 bits) and the error detection span to seven symbols (25 bits).[5]

[5] In most cases, the number of check symbols approximates twice the sum of the number of error symbols correctable and the number of error symbols detectable.

FIG. 1 shows the organization a code unit 100 used in the present embodiment. Code unit 100 includes a 45 symbol combination of 4-bit data and check symbols of a three-way interleaved Reed-Solomon code 101, and a 4-bit "global parity symbol" 102. As shown in FIG. 1, three-way interleaved Reed-Solomon code 110 includes a data field 101 of 36 symbols, and nine check symbols labelled 111–119. In the present embodiment, only 16 bytes (i.e. 32 data symbols) of data field 101 are used. Code unit 100 can be used in numerous applications, e.g. as an ID block to identify a sector of a disk drive. In that application, an ID block is encoded in the format shown in FIG. 1 and written out to the disk drive. In a data retrieval operation, the ID block is read and decoded to verify that the intended sector is accessed.

The check symbols in interleaved Reed-Solomon code 110 are computed over the 36 data symbols in data field 101. Global parity symbol 102 is appended to the end of interleaved Reed-Solomon code 101 and is computed over all 45 4-bit data symbols and check symbols of interleaved Reed-Solomon code 101. In this organization of Reed-Solomon code 110, interleave 2 is to the left of interleave 1, which is in turn left of interleave 0. Note that the last data symbol in data field 101 is always an interleave 0 data symbol.

Figure 2:
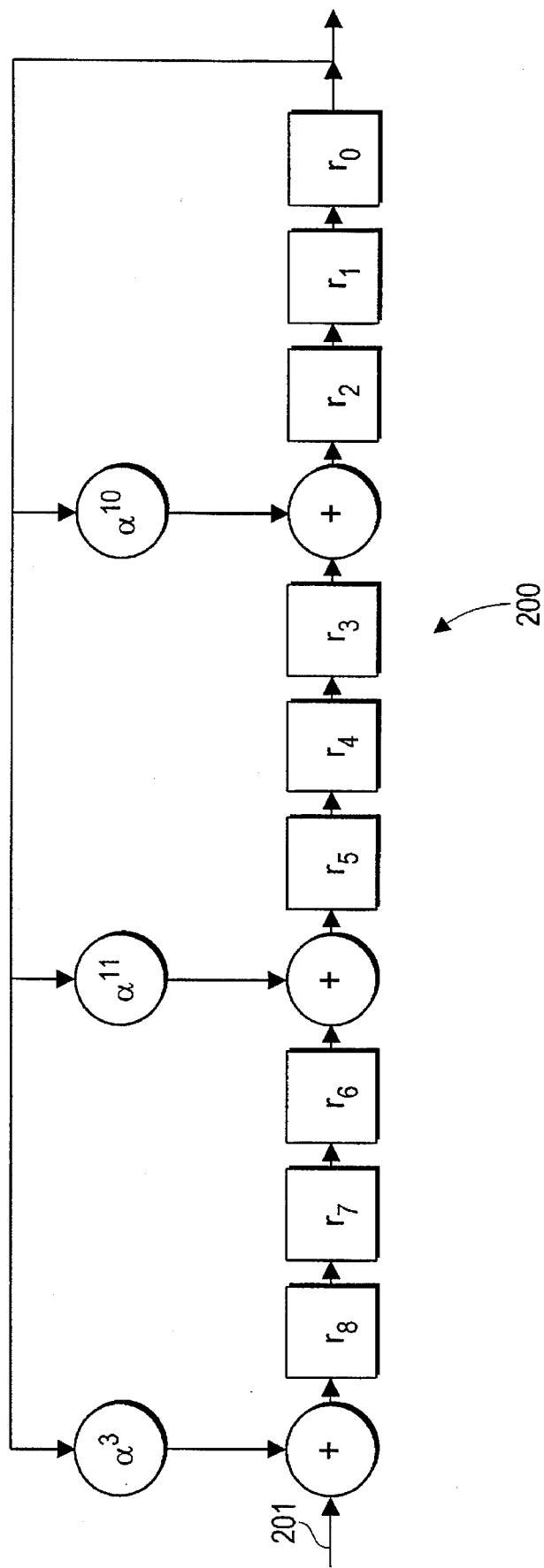
FIG. 2 is a feedback shift register circuit 200 which is used for generating check symbols and which receives one data symbol per clock period.

In the present embodiment, to generate the check symbols in interleaved Reed-Solomon code 101, division by g"(X) is implemented as a cascade of two divisions: first by polynomial $G_1(X)$ and then by polynomial $G_2(X)$. A direct implementation of the division by $G_1(X)$ can be achieved using a feedback linear shift register circuit, such as circuit 200 shown in FIG. 2. The operation of such a direct implementation of polynomial division can be found, for example, in Chapter 7 of the text "Error-Correcting Codes" referenced above. Circuit 200 receives one input data symbol on lead 201 per clock cycle.

In this embodiment, data to be stored, or data retrieved from the mass storage media, are packed in 8-bit bytes. Hence, an efficient check symbol generator is preferably one which operates from the packed bytes without incurring the overhead of unpacking the symbols. An example of such a check symbol generator is shown as shift register circuit 300 in FIG. 3. In shift register circuit 300, data to be stored or data retrieved from the mass storage media are provided two symbols (i.e. 8 bits) per system clock period. When all 36 data symbols are received into circuit 300, registers 301–309 contain the check symbols 111–119 respectively. The check symbols 111–119 are output two symbols at a time in the next five system clock periods, during which global parity symbol 102 continues to be computed. Global parity symbol 102 is output with the last check symbol 119.

However, since check symbol generation circuit 300 receives two input symbols per clock period to generate in shift registers 301–310 the ten check symbols 111–119 and 102, the content of each of shift registers 301–310 after each system clock period must be the same as the corresponding shift registers of feedback shift register circuit 200 (FIG. 2) after two clock periods. The derivation of the logic equations for check symbol generator circuit 300 follows from the requirement that check symbol generation circuit 300 after each system clock period is to be functionally equivalent to feedback shift register circuit 200 after two system clock periods. A derivation of the logic equations for the input value for each of registers 301–310 is illustrated by Table 2.

Table 2 is a table showing the values $f_0$, $f_1$, and $r_0$–$r_9$ in the feedback output terminals 321 and 322, and each of registers 301–310. Table 2 contains three rows labelled states 0–2 respectively. In state 0, the current values of check symbols 111–119 and 102 (i.e. $r_0$–$r_9$) are shown held in registers 301–310. State 1 shows hypothetically, in terms of $f_0$, $f_1$, and $r_0$–$r_9$, the values of feedback output terminals 321 and 322, and each of registers 301–310, after contributions by data symbol $d_h$ (i.e. bits I[7:4] of data byte I) to check symbols 111–119 and 102 are included. State 2 shows the values of feedback output terminals 321 and 322, and each of registers 301–310, after including the contributions to check symbols 111–119 and 102 by data symbol $d_l$ (i.e. I[3:0] of the input data byte I). Feedback shift register circuit 300 transitions to state 2 from state 0 after one system clock period.

Feedback shift register circuit 300 operates in two phases. In the first phase ("phase 1"), indicated by the "shift" signal on node 333 at logic "zero" and during which the 36 data symbols are shifted into feedback shift register circuit 300 two symbols at a time, the values of the check symbols 111–119 and 102 are computed. In the second phase ("phase 2"), indicated by the "shift" signal on node 333 at logic "one", the check symbols 111–119 are shifted out of registers 301–309 two symbols at a time on nodes 331 and 332, while the contributions of check symbols 111–119 to check symbol 102 are computed. Finally, simultaneous with the output of check symbol 109 at node 331, check symbol 102 is output on node 332.

Figure 3:
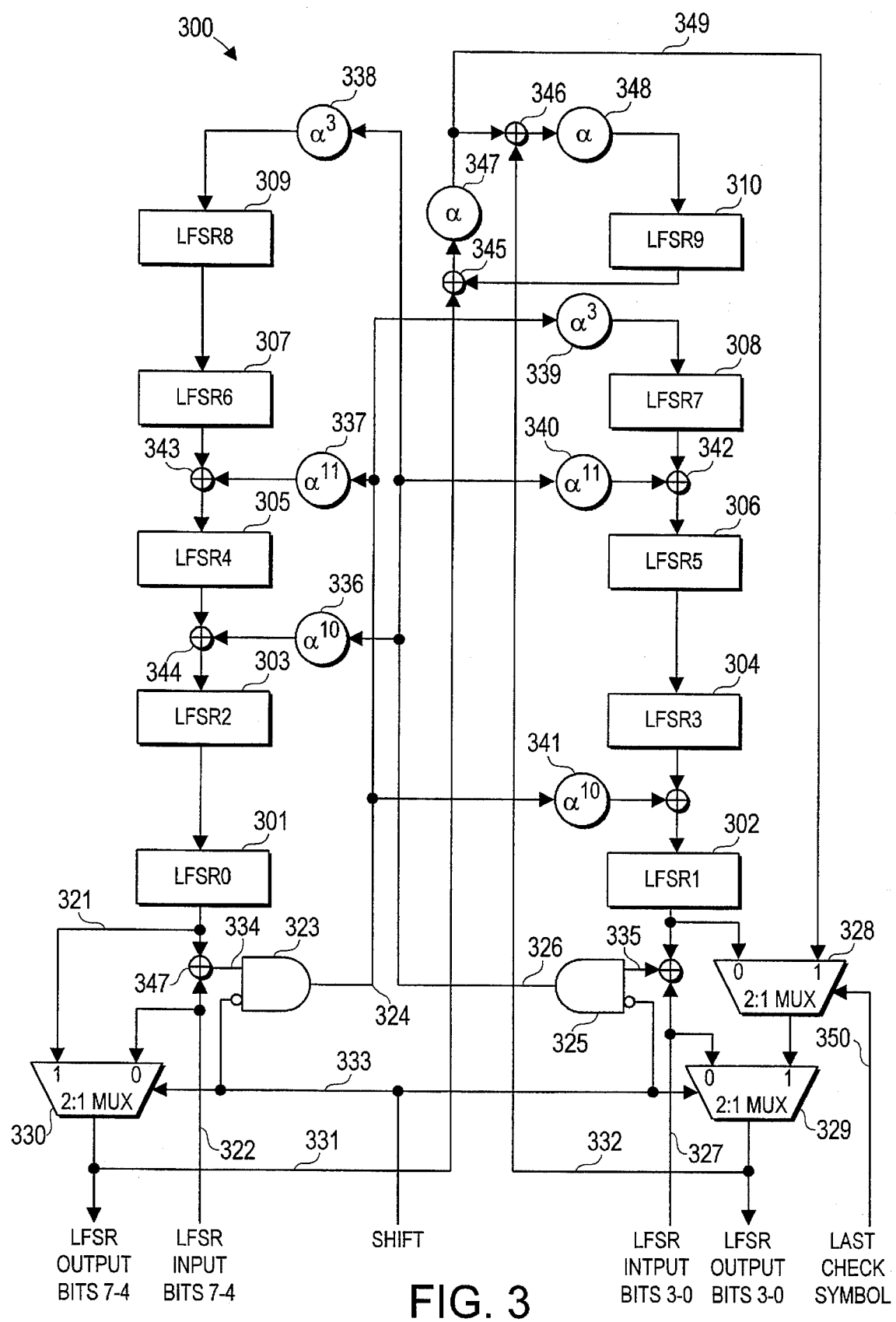
FIG. 3 is a feedback shift register circuit 300 for generating check symbols and which receives two data symbols per clock period, in accordance with one embodiment of the present invention.

Feedback shift register circuit 300 is constructed in accordance with state 2 of Table 2. As shown in FIG. 3, the two input data symbols $d_h$ and $d_l$ are provided on nodes 322 and 327. Data symbols $d_h$ and $d_l$ are summed (i.e. exclusive-ORed) respectively with the output values $r_0$ and $r_1$ of registers 301 and 302 to yield feedback values $(d_h+r_0)$ and $(d_l+r_1)$ on nodes 334 and 335. Prior to arrival of data symbols, registers 301–310 are each initialized to zero. In phase 1, AND gates 323 and 325 are "enabled", transmitting the values $(d_h+r_0)$ and $(d_l+r_1)$ on nodes 334 and 335 to constant multipliers 336–321 in accordance with the logic operations of state 2 of Table 2. For example, the input terminals of feedback shift register 305 receive a value equal to $(d_h+r_0)*\alpha^{11}+r_6$, by operation of multiplier 337 and exclusive-OR circuit 343. The input terminals of shift registers 302, 303, 306, and 308 are similarly provided with the values specified under state 2 of Table 2. In addition, shift registers 301, 304, 307 receives values $r_2$, $r_5$ and $r_8$ respectively, each value representing a shift of two positions (i.e. division by $X^2$). At the same time, the input values $d_h$ and $d_l$ on nodes 322 and 327 are respectively provided, through multiplexers 330 and 329, to summers 345 and 346. At summer 345, the input value $d_h$ is exclusive-ORed (i.e. summed) with the value $r_9$ in shift register 310. The summed value, i.e. $d_h+r_9$, is then multiplied by $\alpha$ at multiplier 347. The result of this multiplication is then summed at summer 346 with input value $d_l$. The result of this summing at summer 346 is then multiplied by $\alpha$ at multiplier 348 to yield a value $\alpha^2(d_h+r_9)+\alpha*d_l$, which is provided as an input value to shift register 310, in accordance with state 2 of table 2.

In phase 2, the input values to multipliers 336–341 are zeroed, so that two shift register chains are formed. The first chain consists of shift registers 301, 303, 305, 307 and 309. The second chain consists of shift registers 302, 304, 306 and 308. Thus, at every system clock period, two check symbols are shifted out of registers 301 and 302 and provided on nodes 331 and 332 through multiplexers 330 and 329. At the same time, except for the last check symbol 119, the output check symbols 111–118, which are provided on nodes 331 and 332, are fed back to summers 345 and 346 for computation of the global parity symbol 102. When the last check symbol 119 is output 331, the control signal on lead 350 is asserted, so that the value at the output terminals of multiplier 347 is provided through multiplexers 328 and 329 to node 332 as global parity symbol 102. In this embodiment, global check symbol 102 results from the exclusive-OR of check symbol 118 and the value in shift register 310, multiplied by $\alpha$, at the time check symbols 117 and 118 are output at nodes 331 and 332. In a storage application, an error condition may exist which causes all symbols stored in the storage system to be zeroed. Under that error condition, as will be evident from the syndrome computation described below, the resulting syndrome coefficients become all zeroes, thereby masking the error condition. To avoid this error condition, the check symbols 110–119 and 102 can be stored bit-wise inverted. Upon data retrieval, i.e. during decoding, check symbols 111–119 and 102 are bit-wise inverted, prior to syndrome computation.

In feedback shift register circuit 300, multipliers 336–341 each multiply a 4-bit output value of either AND gate 323 or AND gate 325 to one of the factors $\alpha^3$, $\alpha^{10}$ and $\alpha^{11}$. Also, multipliers 347 and 348 multiple, respectively, the output values of adders 345 and 346 by the factor $\alpha$. Multipliers 336–341 can each be constructed out of multipliers which multiply a 4-bit data symbol $\beta$ to one of the constants $\alpha$, $\alpha^2$, and $\alpha^3$. To create the multipliers for multiplying the data symbol $\beta$ to the constants $\alpha^{10}$ and $\alpha^{11}$, the following identities in the Galois field $GF(2^4)$ of Table 1 are used:

$$\alpha^{10}\beta=(\alpha^2+\alpha+1)\beta=\alpha^2\beta+\alpha\beta+\beta$$

$$\alpha^{11}\beta=(\alpha^3+\alpha^2+\alpha)\beta=\alpha^3\beta+\alpha^2\beta+\alpha\beta$$

Accordingly, 4-bit multipliers for multiplying $\beta$ to $\alpha$, $\alpha^2$, $\alpha^3$, $\alpha^{10}$, and $\alpha^{11}$ can be implemented from the logic equations shown in Table 3. Table 3 shows the logic equations which are used to construct each of the bits in the output value of these 4-bit multipliers over the Galois field $GF(2^4)$ defined above in Table 1, in which the bits $\beta_3\beta_2\beta_1\beta_0$ represent the bits at bit positions 3, 2, 1, and 0, with bit 0 at the least significant position.

Figure 4A:
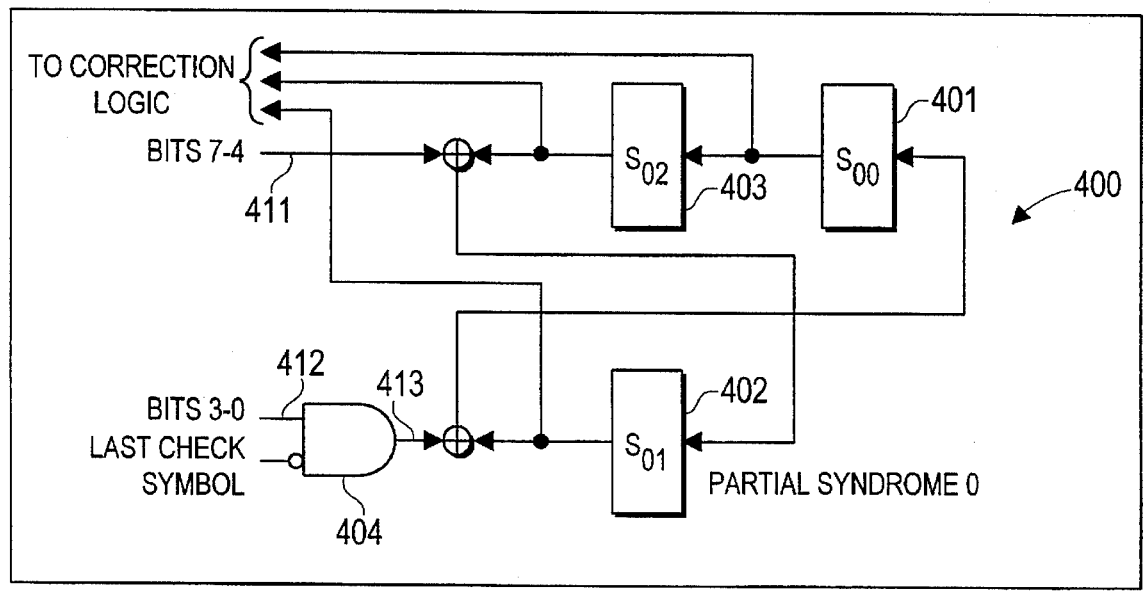
FIG. 4a, 4b and 4c show respectively partial syndrome circuits 400, 430 and 433 for computing the coefficients of partial syndromes $S_0$, $S_1$, and $S_2$ respectively.
Figure 4B:
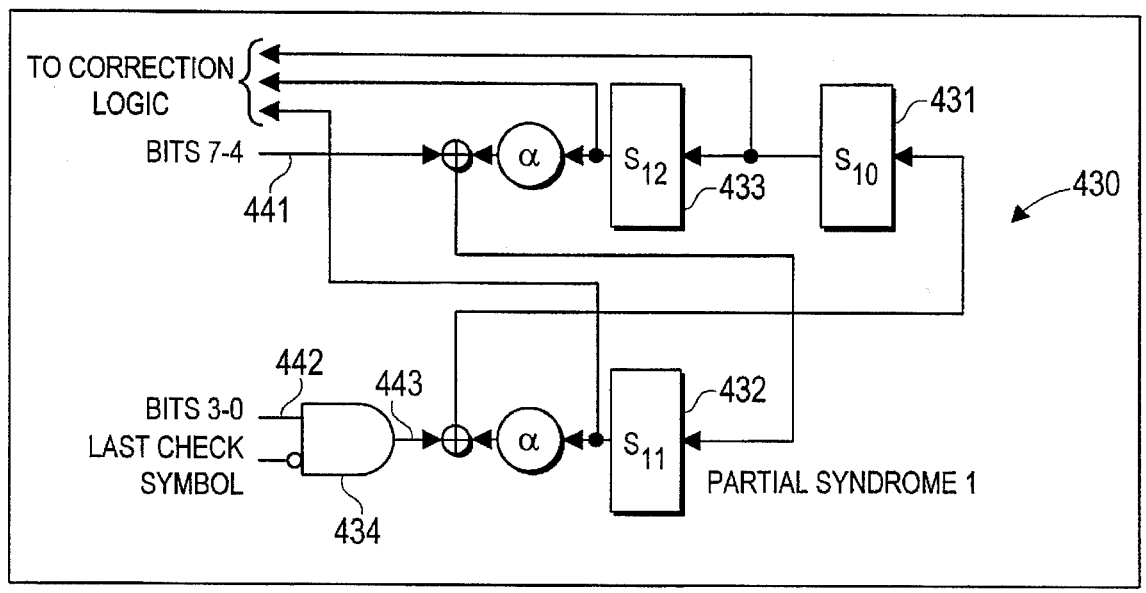
Figure 4C:
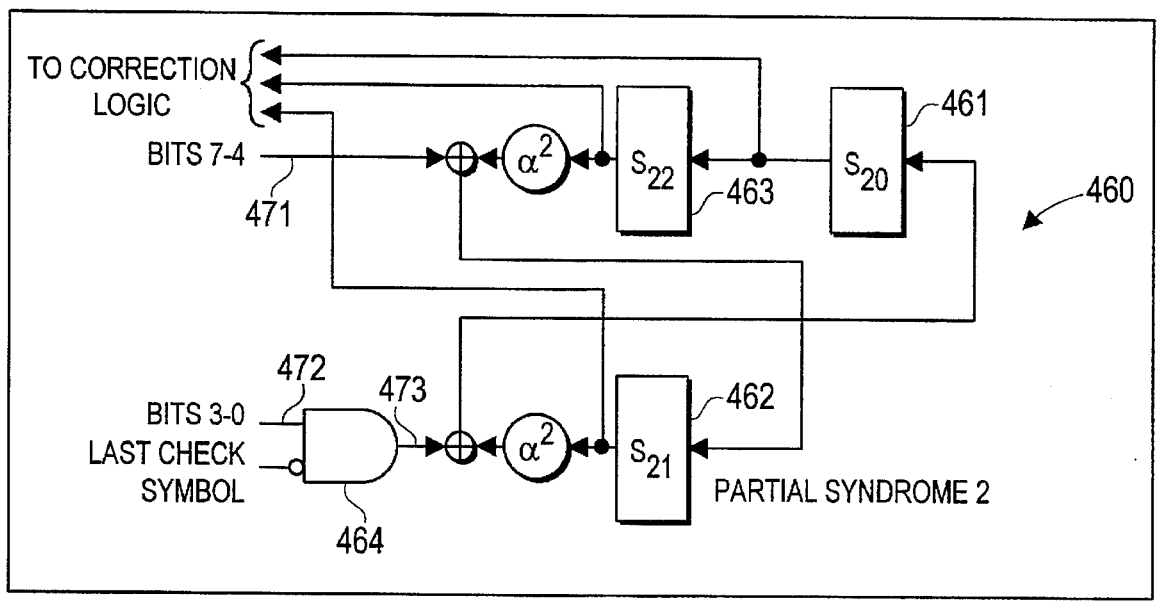

During a decoding operation, the partial syndromes $S_0$, $S_1$, $S_2$ are computed in accordance with the equations for $S_i$, i=0, 1, and 2 above. FIGS. 4a, 4b and 4c show respectively partial syndrome circuits 400, 430 and 460 for computing partial syndromes $S_0$, $S_1$, and $S_2$. Circuits 400, 430 and 460, similar to linear feedback shift register circuit 300 above, receive the same two data symbols $d_h$ and $d_l$ per system clock period on leads 411 and 412, 441 and 442, and 471 and 472 respectively. Accordingly, the logic equations for the next coefficients of partial syndromes $S_i$ (i=0, 1, and 2) in partial syndrome circuits 400, 430 and 460 are provided in Table 4. Table 4 expresses in terms of input values $d_h$ and $d_l$, and the previous values $r_{ij}$ (i,j=0, 1, and 2), partial syndromes $S_i$. In addition, Table 4 also shows the computation of $S_{GP}$ as a function of input data symbols $d_h$ and $d_l$.

Thus, partial syndrome circuit 400 computes the coefficients $S_{02}$, $S_{01}$, and $S_{02}$ of partial syndrome $S_0$, partial syndrome circuit 430 computes the coefficients $S_{12}$, $S_{11}$, and $S_{10}$ of partial syndrome $S_1$, and partial syndrome circuit 460 computes the coefficients $S_{22}$, $S_{21}$, and $S_{20}$ of partial syndrome $S_2$. When all data symbols are received into partial syndrome circuits 400, 430 and 460, registers 401–403, 431–433, and 461–463 contains the coefficients $S_{00}$, $S_{01}$, $S_{02}$, $S_{10}$, $S_{11}$, $S_{12}$, $S_{20}$, $S_{21}$, and $S_{22}$ respectively. Registers 401–403, 431–433, and 461–463 are initialized to zero prior to the arrival of any of the 36 data symbols of Reed-Solomon code 101. When the last check symbol (global parity symbol 102) is output, the input signals at 413, 443, and 473 are zeroed.

In practice, coding and decoding of data symbols do not occur simultaneously. For example, in a communication application, encoding is performed only during data transmission and decoding is performed only during data reception. Similarly, in a storage application, encoding is performed only when data are stored, and decoding is performed only during data retrieval. Thus, registers can be shared between the coding and decoding circuits. In this embodiment, registers 301–309 are also used as registers 401–403, 431–433, and 461–463.

Partial syndrome $S_{GP}(X)$ of the global parity check symbol 102 is computed using circuit 300. As explained above, to take advantage of the additional data integrity assurance of the Reed-Solomon code, the coefficients $S_{30}$, $S_{31}$, and $S_{32}$ are estimated. The estimated coefficients, denoted $ES_{30}$, $ES_{31}$, and $E_{32}$ are derived from $S_{2w_0}$, $S_{1w_0}$, and $S_{0w_0}$, where $w_0=0$, 1, and 2. The syndrome $S_{GP}$ of global parity check symbol 102 cannot be verified against an estimated $S_{GP}$ until check symbols 110–119 are computed. The syndrome $S_{GP}$ is stored in register 310 and provided on node 349 as $\alpha S_{GP}$. If no error is encountered, the final estimated partial syndrome $ES_{GP}$ should equal partial syndrome $S_{GP}$, where $ES_{GP}$ is defined as:

$$ES_{GP}=ES_{32}\alpha^2+ES_{31}\alpha+ES_{30}$$

A syndrome $S_{GP2}$ is obtained by summing the estimated $ES_{GP}$ and $S_{GP}$:

$$S_{GP2}=\alpha^{-1}(S_{GP}\alpha)+ES_{GP}$$

Figure 7:
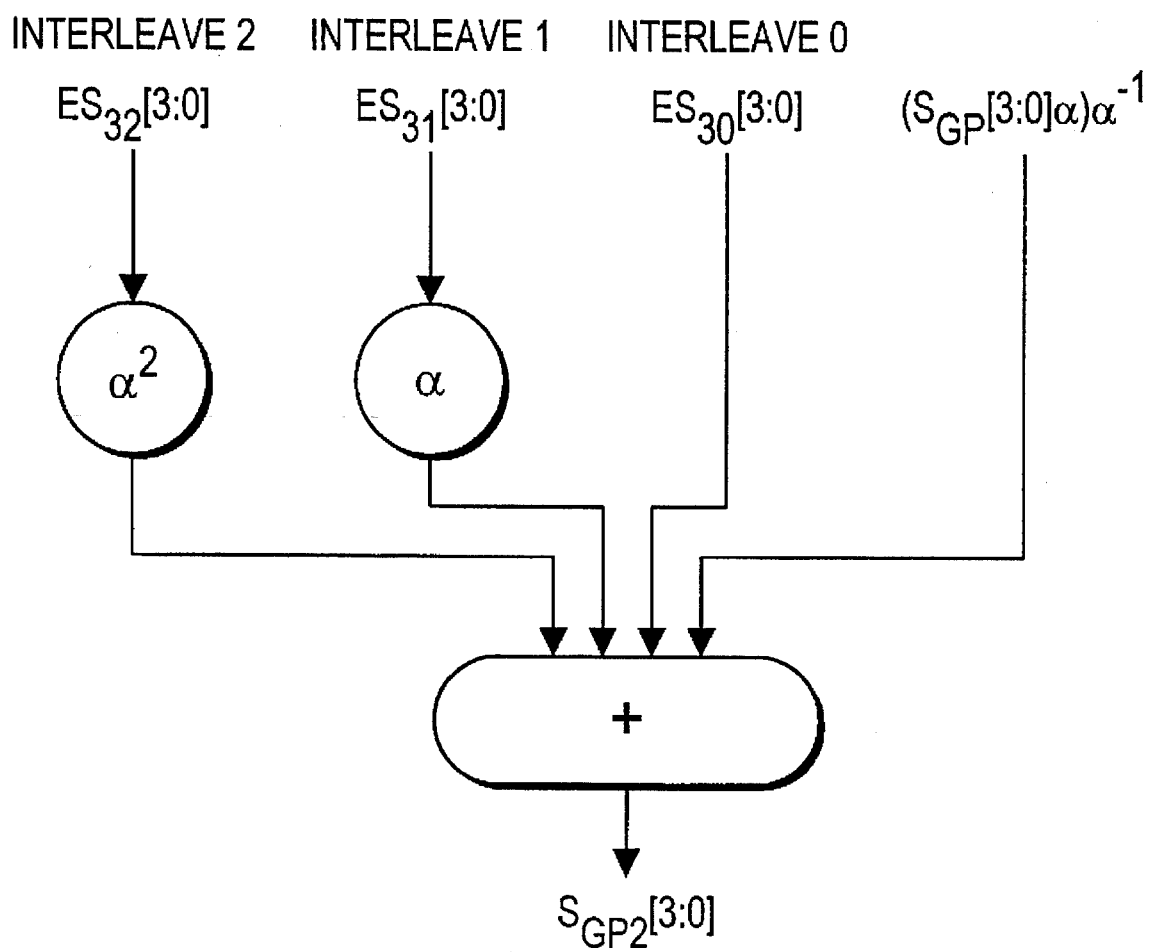
FIG. 7 shows a schematic circuit for computing a global parity syndrome $S_{GP2}$ based on an estimated global parity syndrome $ES_{GP}$ and a computed global parity syndrome $S_{GP}$.

In this embodiment, $S_{GP2}$ is implemented in hardware by the circuit represented schematically in FIG. 7. The input values $ES_{3w_0}$ ($w_0=0$, 1, and 2) in FIG. 7 are provided by a circuit 500 illustrated by FIG. 5 discussed below.

As mentioned above, to minimize hardware in one implementation, a burst limiting circuit, described below, is provided to limit error correction to within a 9-bit burst, or no more than one symbol error in each interleave.

Also, error location $1_{w_0}$ in interleave $w_0$ is provided by the equation:

$$l_{w_0} = \log\frac{S_{2w_0}}{S_{1w_0}} = \log\frac{S_{1w_0}}{S_{0w_0}}$$

To locate the physical location within the Reed-Solomon code 101, a value $NIBBLE_{w_0}$ is computed in each interleave $w_0$ from error location $1_{w_0}$:

$$NIBBLE_{w_0}=9-i-3*1_{w_0}$$

This value $NIBBLE_{w_0}$ specifies the physical location of the data or check symbol where the error occurred. The value of $NIBBLE_{w_0}$ indicates the location of the error nibble, as measured from check symbol 111. For example, if the length of the data field is 16 bytes, and $NIBBLE_{w_0}$ has a value of −3, then the error occurs at the lower nibble of byte 15. Tables 5a, 5b and 5c show the physical error locations in each of interleaves 0, 1, and 2 respectively. Consequently also, a $NIBBLE_{w_0}$ value between 0–8 indicates an error occurring in one of the 5 check bytes in interleaved Reed Solomon code 110. If the negative value of $NIBBLE_{w_0}$ has a magnitude greater than twice the length of data field 101, then an out of range error has occurred.

Figure 5:
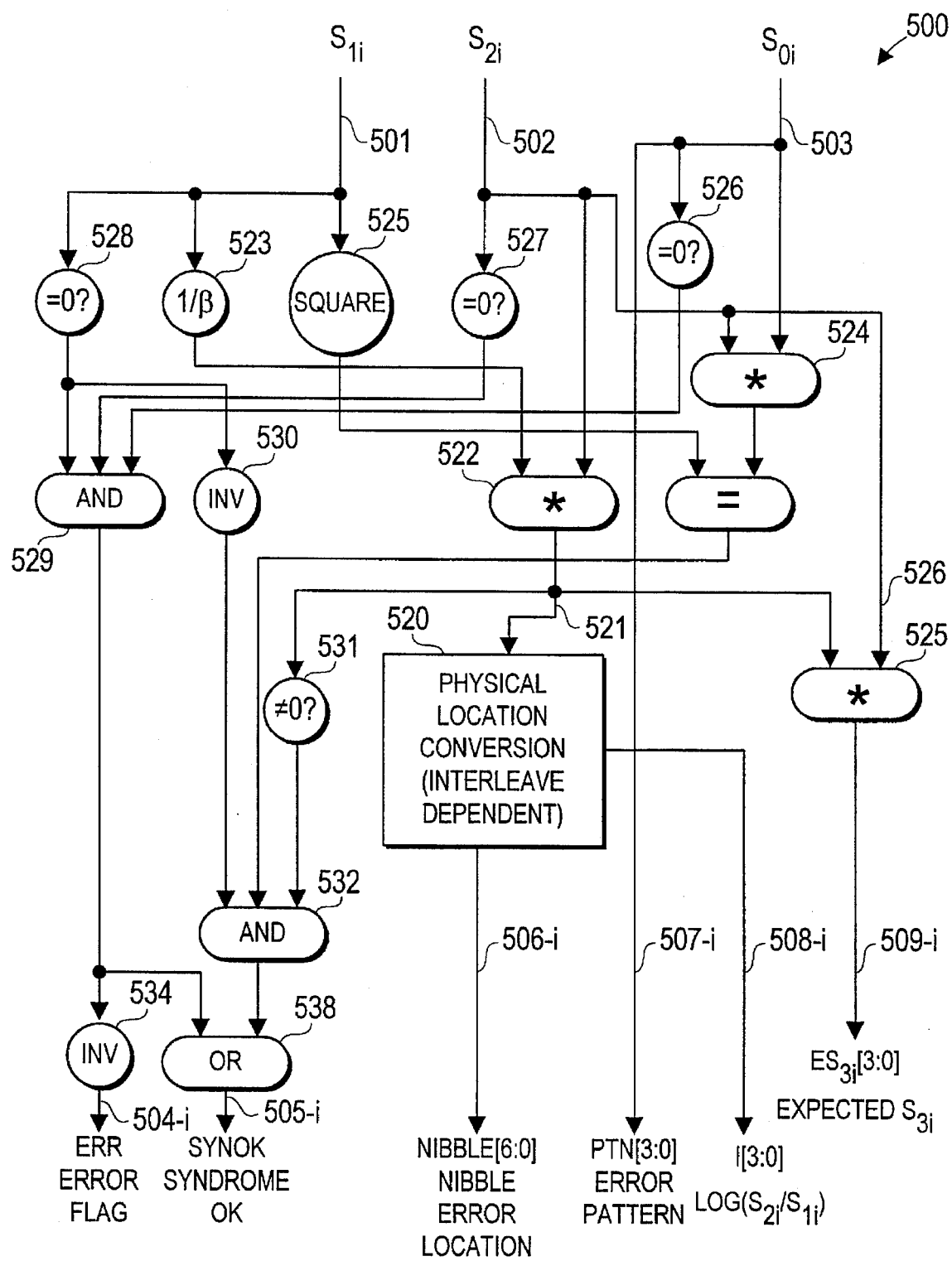
FIG. 5 shows schematically a decoder 500 in accordance with the present invention.

FIG. 5 shows schematically a decoder circuit 500 for interleave $w_0$ in accordance with the present invention. As shown in FIG. 5, partial syndromes $S_{1w_0}$, $S_{2w_0}$, and $S_{0w_0}$ are provided as input values to circuit 500. Circuit 500 provides as an output value a 7-bit output value of $NIBBLE_{w_0}$ ($NIBBLE[6:0]$) on bus 506 the error pattern $S_{0w_0}$ on 4-bit bus 507 the 4-bit error location $ES_{3w_0}$, and the expected 4-bit estimated partial syndromes $ES_3w_0$ are combined three estimated partial syndrome $ES_{3w_0}$ on bus 509. The (described below) to derive syndrome $S_{GP}$. As mentioned above with respect to FIG. 7, when $S_{GP}$ is non-zero, the error pattern is given by:

$$S_{GP2}=ES_{32}\alpha^2+ES_{31}\alpha+ES_{30}+(S_{GP}\alpha)\alpha^{-1}$$

where '+' denotes an "exclusive or" operation.

The value of $NIBBLE_{w_0}$ in the present embodiment is computed by a table look-up in circuit 520 using the value $$\log\frac{S_{2w_0}}{S_{1w_0}}$$

on bus 521, which is computed in multiplier 522 as the product of the value $S_{2w_0}$ on bus 502, with the output value of inverse circuit 523. Inverse circuit 523 provides as output the multiplicative inverse of $S_{1w_0}$ in the $GF(2^4)$ Galois field defined in Table 1. Inverse circuit 523 implements a table look-up of multiplicative inverses. The multiplicative inverses of the elements in the Galois field $GF(2^4)$ of Table 1 are shown in Table 7. Multipliers 522 and 524 are 4-bit by 4-bit general purpose multipliers in the Galois field $GF(2^4)$.

The value $ES_{3w_0}$ is computed in multiplier 525 as the product of the value $$\frac{S_{2w_0}}{S_{1w_0}}$$

and $S_{2w_0}$. In this embodiment, if $S_{0w_0}$, $S_{1w_0}$, and $S_{2w_0}$ are all zero (as determined by comparators 526, 527 and 528), or if $S_{0w_0}*S_{2w_0}$ equals $S_{1w_0}^2$, then it may be concluded that either no error has occurred, or a correctable error has occurred in interleave $w_0$. Any other condition signifies the occurrence of an uncorrectable error. In circuit 500, the value of $S_{1w_0}^2$ computed by squaring multiplier 525. Squaring multiplier 525 implements the following equation, for $\beta=[\beta_3\ \beta_2\ \beta_1\ \beta_0]$, in the Galois field $GF(2^4)$ defined in Table 1:

$$\beta^2 = \beta_3\alpha^3 + (\beta_3 + \beta_1)\alpha^2 + \beta_2\alpha + (\beta_2 + \beta_0)$$
$$= [\beta_3\ (\beta_3 + \beta_1)\ \beta_2\ (\beta_2 + \beta_0)]$$

Circuit 500 provides as output signals two error flags $SYNOK_{w_0}$ and $ERR_{w_0}$ for each interleave $w_0$. $SYNOK_{w_0}$, when set, signals either (a) no error, or (b) a correctable error is detected in the interleave $w_0$. When reset, $SYNOK_{w_0}$ represents occurrence of an uncorrectable error. These error conditions are summarized in Table 6. A global error control signal ERR is provided to indicate that an error is detected. The error control signal ERR is derived in the present embodiment by:

$$ERR=ERR_2 \vee ERR_1 \vee ERR_0 \vee (S_{GP}\neq 0)$$

where $\vee$ denotes an "OR" operation.

In addition, a control signal ERRINGP is set when an error is detected in the global parity symbol. ERRINGP is derived by:

$$ERRINGP=\overline{ERR_0} \wedge (S_{GP2}\neq 0)$$

where $\wedge$ denotes an "AND" operation.

The 4-bit error patterns ERRPAT0, ERRPAT1, and ERRPAT2 are provided by the equations:

$$ERRPAT0=S_{00}+S_{GP2}$$

$$ERRPAT1=S_{01}$$

$$ERRPAT2=S_{02}$$

Error patterns ERRPAT0, ERRPAT1 and ERRPAT2 are provided to derive the error patterns for error correction.

The present embodiment corrects a single burst error spanning no more than 3 symbols. Within interleaved Reed-Solomon code 101, the first error symbol in such a single error burst can occur in any one of the following six situations: (a) in interleave 2, at the lower nibble of a byte, with a 2-byte error pattern ERRPAT given by {0000, ERRPAT2, ERRPAT1, ERRPAT0}; (b) in interleave 2, at the upper nibble of a byte, with a 2-byte error pattern ERRPAT given by {ERRPAT2, ERRPAT1, ERRPAT0, 0000}; (c) in interleave 1, at the lower nibble of a byte, with a 2-byte error pattern ERRPAT given by {0000, ERRPAT1, ERRPAT0, ERRPAT2}; (d) in interleave 1, at the upper nibble of a byte, with a 2-byte ERRPAT error pattern given by {ERRPAT1, ERRPAT0, ERRPAT2, 0000}; (e) in interleave 0, at the lower nibble of a byte, with a 2-byte error pattern ERRPAT given by {0000, ERRPAT0, ERRPAT2, ERRPAT1}; and (f) in interleave 1, at the upper nibble of a byte, with a 2-byte error pattern ERRPAT given by {ERRPAT0, ERRPAT2, ERRPAT1, 0000}. In addition, if a single burst error is detected in global parity symbol 102, as indicated by error control signal ERRINGP, the error is correctable if no error is detected in interleave 0. In that case, the 2-byte error pattern ERRPAT is given by {0000, ERRPAT2, ERRPAT1, ERRPAT0}y. In view that an error in global check symbol 102 is correctable only if no error occurs in interleave 0, certain portions of the error correction data path can be shared between the error pattern ERRPAT0 in interleave 0 and the global check symbol's error pattern.

Any error within the burst limit of this embodiment can be corrected by locating the consecutive two bytes ERRBYTEA and ERRBYTEB at which the error occurs. To correct ERRBYTEA and ERRBYTEB, ERRBYTEA and ERRBYTEB are exclusive-ORed with the 2-byte error pattern ERRPAT. In this embodiment, errors other than the correctable errors enumerated above are not corrected.

Figure 6:
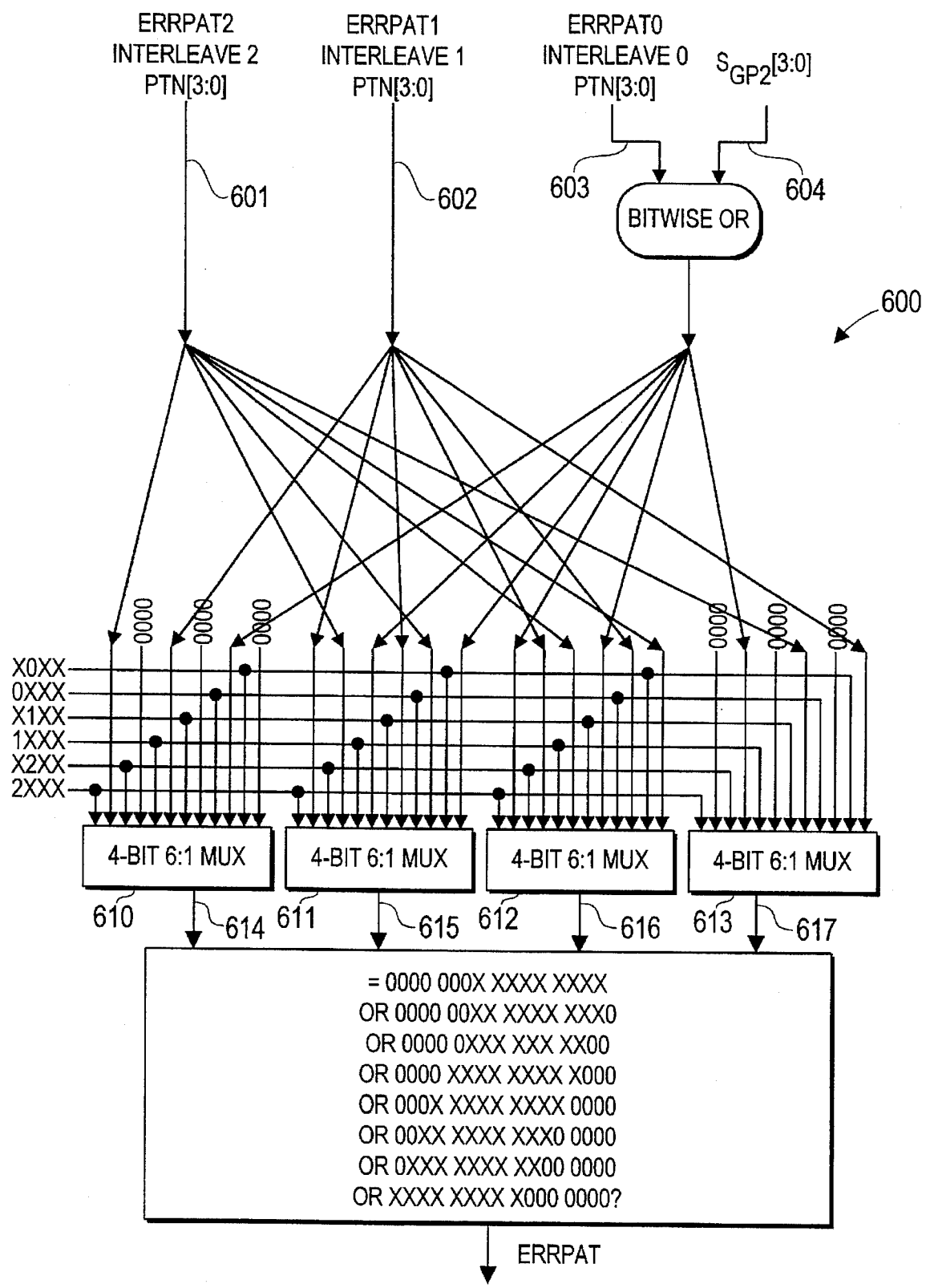
FIG. 6 shows a burst limiter circuit 500 providing a 2-byte error pattern ERRPAT from the error patterns in each interleave and the error pattern corresponding to a global parity error.

FIG. 6 shows a burst limiter circuit 500 providing a 2-byte error pattern ERRPAT from the error patterns in each interleave and the error pattern corresponding to an error in global check symbol 102. As shown in FIG. 6, 4-bit error patterns ERRPATi from interleaves 0–2 and global error pattern $S_{GP2}$ are received on 4-bit busses 601–604 into burst limiter circuit 600. ERRPAT0 is bitwise-ORed with $S_{GP2}$ to be used as an input value to four 4-bit 6:1 multiplexers 610–613. The other input data to the 4-bit 6:1 multiplexers 610–613 are ERRPAT1, ERRPAT2, and a constant value '0000. Multiplexers 610–613 are selected by control signals XOXX, 0XXX, X1XX, 1XXX, X2XX, and 2XXX. Control signal $Xw_0XX$, $w_0$=0, 1 or 2, represents the condition in which the first error in a single error burst occurs in interleave $w_0$ and at the lower nibble of a byte. Control signal $w_0XXX$, $w_0$=0, 1 or 2, represents the condition in which the first error in a single error burst occurs in interleave $w_0$ and at the upper nibble of a byte. Of course, as discussed above, to take advantage that a correctable error in global check symbol 102 cannot occur simultaneously with an error in interleave 0 and which is an upper nibble of a byte, control signal 0XXX is also set when the global check symbol 102 contains an error.

The above detailed description is provided to illustrate the embodiments of the present invention, and should not be taken as limiting the scope of the present invention. Various modifications and variations within the scope of the present invention are possible. For example, even though the present invention is illustrated by operations in the Galois field $GF(2^4)$, one of ordinary skill would appreciate the principles of the present invention are equally applicable to Galois fields of other cardinalities. The present invention is defined by the following claims.

We claim:

1. A method for providing a w-way interleaved Reed-Solomon error correcting code word in a data storage or data communication application, comprising the steps of:

receiving a plurality of data symbols;

computing, in each interleave a code word including said data symbols and a plurality of check symbols, said check symbols being generated by a generator polynomial given by:

$$G(X)=(X+\alpha^j)(X+\alpha^{j+1})(X+\alpha^{j+2}) \ldots (X+\alpha^{j+i-1})(X+\alpha^{j+i})$$

where $\alpha$ is a primitive element of $GF(2^m)$ and, i and j are integers;

providing a global parity symbol GP associated with a syndrome $S_{GP}$ given by one of:

$$S_{GP} = \sum_{w_0=0}^{w-1} S_{(i+j+1)w_0} \gamma_{w_0}$$

or $$S_{GP} = \sum_{w_0=0}^{w-1} S_{(j-1)w_0} \gamma_{w_0}$$

where $\gamma_0, \gamma_1, \ldots \gamma_{w-1}$ are non-zero elements of a galois field $GF(2^m)$, and $S_{(i+j+1)w_0}$ and $S_{(j-1)w_0}$ are, respectively, the partial syndromes corresponding to $(X+\alpha^{i+j+1})$ and $(X+\alpha^{j-1})$ for interleave $w_0$; and for each interleave, transmitting to a storage device or a transmission medium, in accordance with said data storage or data communication application, said code word and said associated global parity symbol GP;

wherein said check symbols are generated by a single generator polynomial:

$$G_w(X)=(X^w+\alpha^j)(X^w+\alpha^{j+1}) \ldots (X^w+\alpha^{j+i-1})(X^w+\alpha^{j+i}).$$

2. A method as in claim 1, wherein said the number w of interleaves divides (j+i+1), and said global parity symbol GP being computed over all interleaves using a single second generator function $$\left(X+\alpha^{\frac{(i+j+1)}{w}}\right).$$

3. A method as in claim 1, wherein said number w of interleaves divides (j−1), and said global parity symbol GP being computed over all interleaves using a single second generator function $$\left(X+\alpha^{\frac{(j-1)}{w}}\right).$$

4. A method as in claim 1, wherein said global parity symbol GP is computed as part of said Reed-Solomon error correcting code word, such that an error in said global parity symbol is detected by a non-zero syndrome computed from said check symbols and said global parity symbol.

5. A method as in claim 1, wherein said global parity symbols and said check symbols are generated simultaneously by the generator polynomial:

$$G_w(X) = (X^w + \alpha^j)(X^w + \alpha^{j+1})\ldots$$

$$\ldots (X^w + \alpha^{j+i-1})(X^w + \alpha^{j+i})\left(X + \alpha^{\frac{(i+j+1)}{w}}\right).$$

6. A method as in claim 1, wherein said global parity symbols and said check symbols are generated simultaneously by the generator polynomial:

$$G_w(X) = (X^w + \alpha^j)(X^w + \alpha^{j+1})\ldots$$

$$\ldots (X^w + \alpha^{j+i-1})(X^w + \alpha^{j+i})\left(X + \alpha^{\frac{(i+j+1)}{w}}\right).$$

7. A method as in claim 1, further comprising:
receiving from said storage device or transmission medium said Reed-Solomon error correcting code word; and
decoding said error correction and detecting code by computing partial syndromes $S_j, S_{j+i}, S_{j+2}, \ldots, S_{j+i}$, of said generator function and said syndrome $S_{GP}$;
wherein said Reed-Solomon error correcting code is 3-way interleaved, said method further comprises the step of estimating said syndrome $S_{GP}$ using the relation:

$$S_{GP} = S_3(\alpha) = S_{32}\alpha^2 + S_{31}\alpha + S_{30}.$$

8. A method as in claim 7, wherein said Reed-Solomon error correcting code is 3-way interleaved and said global parity symbol GP is generated by a polynomial $(X+\alpha^v)$, where v is an integer, said method further comprising the step of estimating said syndrome $S_{GP}$ using the relation:

$$S_{GP} = S_{32}\alpha^{2v} + S_{31}\alpha^v + S_{30}.$$

9. A method as in claim 7, wherein said Reed-Solomon error correction code is 3-way interleaved, further comprising the step of estimating said syndrome $S_{GP}$ using the relation:

$$S_{GP} = S_{32}\alpha_2 + S_{31}\alpha_1 + S_{30}\alpha_0$$

where $\alpha_0$, $\alpha_1$ and $\alpha_2$ are non-zero elements of said Galois field.

* * * * *

UNITED STATES PATENT AND TRADEMARK OFFICE
CERTIFICATE OF CORRECTION

PATENT NO. : 5,642,366
DATED : June 24, 1997
INVENTOR(S) : Lee, Frank S.; Miller, David H.; Koralek, Richard W.

It is certified that error appears in the above-identified patent and that said Letters Patent is hereby corrected as shown below:

Col. 4, line 22, delete "(X+aj+i-1)" and insert --$(X+\alpha^{j+i-1})$--.

Col. 7, line 44, delete "$S_{(i+j+1)}W_O$ and $S_{(j-1)}W_O$" and insert --$S_{(i+j+1)}W_0$ and $S_{(j-1)}W_0$--.

Col. 9, line 8, delete "$S_2WO$ and $S_1WO$" and insert --$S_2W_0$ and $S_1W_0$--.

Signed and Sealed this

Tenth Day of March, 1998

BRUCE LEHMAN

*Attest:*

*Attesting Officer*        Commissioner of Patents and Trademarks